United States Patent
Zhang

(10) Patent No.: US 11,107,711 B2
(45) Date of Patent: Aug. 31, 2021

(54) MICRO LIGHT EMITTING DIODE TRANSFERRING APPARATUS, METHOD FOR TRANSFERRING MICRO LIGHT EMITTING DIODE, AND DISPLAY APPARATUS

(71) Applicants: BEIJING BOE DISPLAY TECHNOLOGY CO., LTD., Beijing (CN); BOE Technology Group Co., Ltd., Beijing (CN)

(72) Inventor: Di Zhang, Beijing (CN)

(73) Assignees: BEIJING BOE DISPLAY TECHNOLOGY CO., LTD., Beijing (CN); BOE Technology Group Co., Ltd., Beijing (CN)

(*) Notice: Subject to any disclaimer, the term of this patent is extended or adjusted under 35 U.S.C. 154(b) by 29 days.

(21) Appl. No.: 16/639,110

(22) PCT Filed: Mar. 20, 2019

(86) PCT No.: PCT/CN2019/078882
§ 371 (c)(1),
(2) Date: Feb. 13, 2020

(87) PCT Pub. No.: WO2020/186479
PCT Pub. Date: Sep. 24, 2020

(65) Prior Publication Data
US 2021/0134624 A1  May 6, 2021

(51) Int. Cl.
*H01L 21/67* (2006.01)
*H01L 21/68* (2006.01)
*H01L 25/16* (2006.01)

(52) U.S. Cl.
CPC ........ *H01L 21/67144* (2013.01); *H01L 21/68* (2013.01); *H01L 25/167* (2013.01)

(58) Field of Classification Search
CPC ............... H01L 2224/75754–75755; H01L 2224/81136; H01L 2224/95136;
(Continued)

(56) References Cited

U.S. PATENT DOCUMENTS

2008/0210368 A1\* 9/2008 Zakel ............... H01L 24/31
156/230
2018/0166429 A1\* 6/2018 Chong ............. H01L 21/6835
(Continued)

FOREIGN PATENT DOCUMENTS

CN    102290361 A    12/2011
CN    107146769 A    9/2017
(Continued)

OTHER PUBLICATIONS

International Search Report & Written Opinion dated Dec. 20, 2019, regarding PCT/CN2019/078882.

*Primary Examiner* — Alia Sabur
(74) *Attorney, Agent, or Firm* — Intellectual Valley Law, P.C.

(57) ABSTRACT

A micro light emitting diode (micro LED) transferring apparatus is provided. The micro LED transferring apparatus includes a transfer array including an array of a plurality of transfer heads; and an array mask having an array of a plurality of alignment holes. A respective one of the plurality of alignment holes has a size allowing a respective one of the plurality of transfer heads and a micro LED attached to the respective one of the plurality of transfer heads to pass through.

18 Claims, 7 Drawing Sheets

(58) Field of Classification Search
CPC ....... H01L 2224/8114; H01L 2224/757; H01L 21/67144; H01L 21/68
See application file for complete search history.

(56) References Cited

U.S. PATENT DOCUMENTS

| | | | |
|---|---|---|---|
| 2018/0248090 A1* | 8/2018 | Huska | H01L 24/81 |
| 2018/0342643 A1* | 11/2018 | Lu | H01L 33/005 |
| 2019/0035662 A1 | 1/2019 | Wu | |

FOREIGN PATENT DOCUMENTS

| | | |
|---|---|---|
| CN | 107910413 A | 4/2018 |
| CN | 109256351 A | 1/2019 |

* cited by examiner

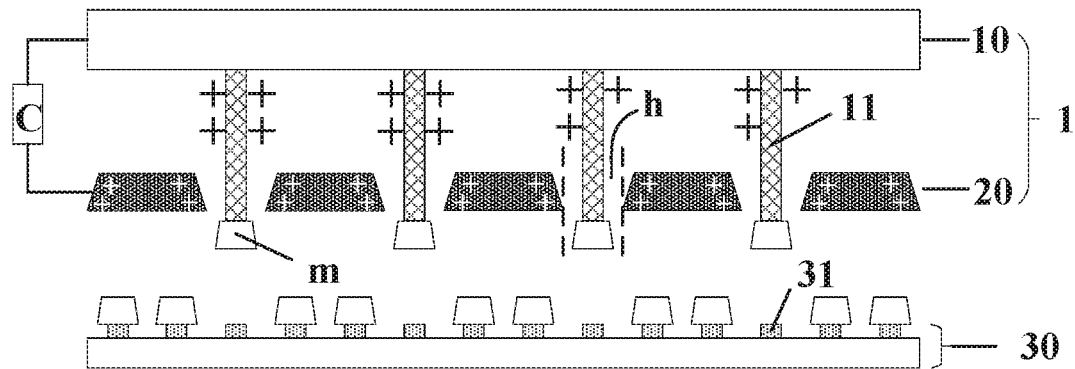
FIG. 4
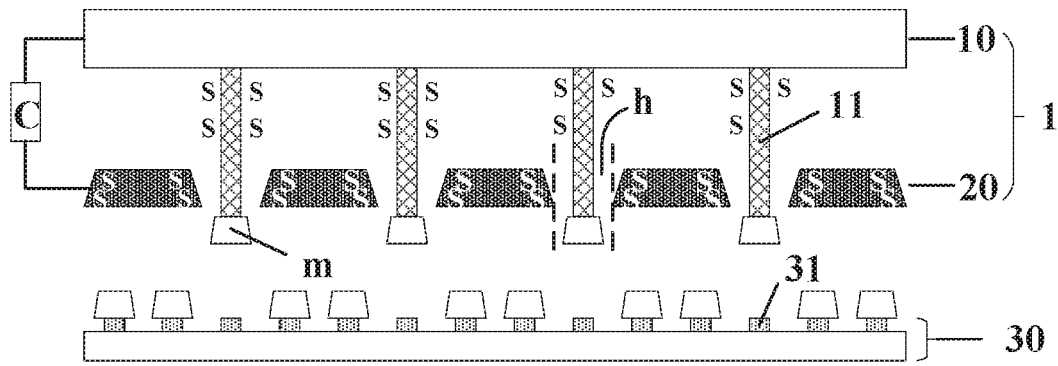
FIG. 5
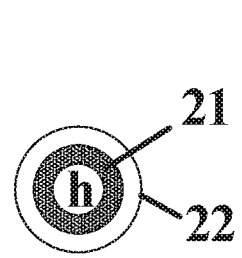 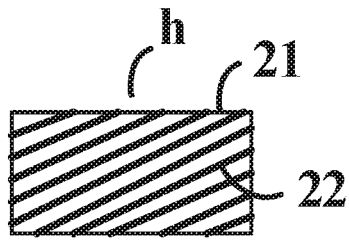
FIG. 6      FIG. 7 placing a transfer array on a side of an array mask and a target substrate so that the array mask is disposed between the transfer array and the target substrate, the transfer array comprising an array of a plurality of transfer heads and having a plurality of micro LEDs respectively attached to the plurality of transfer heads, the array mask having an array of a plurality of alignment holes, and the target substrate having a bonding layer comprising an array of a plurality of bonding contacts aligning the array of the plurality of micro LEDs respectively attached to the array of the plurality of transfer heads with the array of the plurality of alignment holes inserting the array of the plurality of transfer heads respectively through the array of the plurality of alignment holes placing the array of the plurality of micro LEDs respectively on the array of the plurality of bonding contacts releasing the array of the plurality of micro LEDs onto the target substrate

FIG. 8

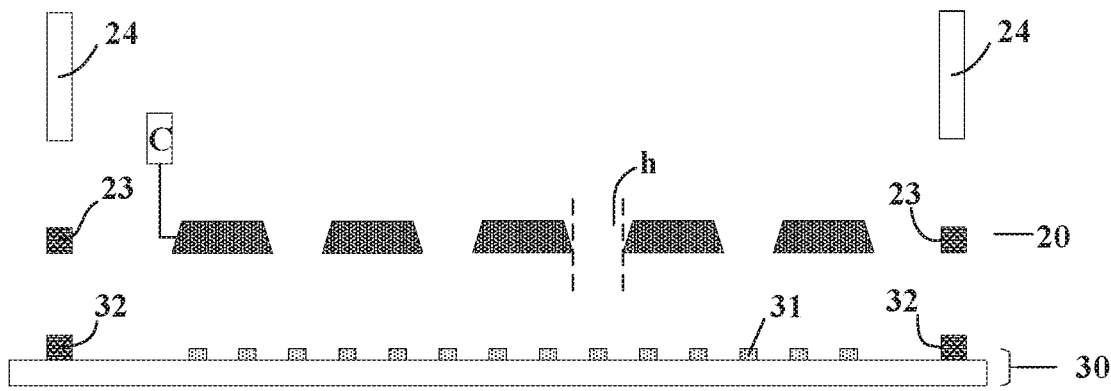

FIG. 9A

MICRO LIGHT EMITTING DIODE TRANSFERRING APPARATUS, METHOD FOR TRANSFERRING MICRO LIGHT EMITTING DIODE, AND DISPLAY APPARATUS

CROSS-REFERENCE TO RELATED APPLICATION

This application is a national stage application under 35 U.S.C. § 371 of International Application No. PCT/CN2019/078882, filed Mar. 20, 2019, the contents of which are incorporated by reference in the entirety.

TECHNICAL FIELD

The present invention relates to display technology, more particularly, to a micro light emitting diode transferring apparatus, a method for transferring a micro light emitting diode, and a display apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides a micro light emitting diode (micro LED) transferring apparatus, comprising a transfer array comprising an array of a plurality of transfer heads; and an array mask having an array of a plurality of alignment holes; wherein a respective one of the plurality of alignment holes has a size allowing a respective one of the plurality of transfer heads and a micro LED attached to the respective one of the plurality of transfer heads to pass through.

Optionally, the array mask comprises an array of a plurality of ring structures, a respective one of the plurality of ring structures defining the respective one of the plurality of alignment holes.

Optionally, the micro LED transferring apparatus further comprises a controller configured to form an alignment mechanism for aligning the respective one of the plurality of transfer heads and the micro LED attached to the respective one of the plurality of transfer heads with respect to the respective one of the plurality of alignment holes when the respective one of the plurality of transfer heads is inserted into the respective one of the plurality of alignment holes; wherein the controller is coupled to the transfer array and the array mask.

Optionally, the controller is configured to apply a first voltage to the array of the plurality of transfer heads and apply a second voltage to the array mask at least in regions surrounding the array of the plurality of alignment holes; and the first voltage and the second voltage are of a same polarity.

Optionally, the alignment mechanism comprises magnetic portions respectively in regions surrounding the array of the plurality of alignment holes and exposed magnetic portions of the array of the plurality of transfer heads.

Optionally, the controller is configured to apply a magnetic field to the array of the plurality of transfer heads so that the exposed magnetic portions of the array of the plurality of transfer heads have a same magnetic polarity as the magnetic portions respectively in regions surrounding the array of the plurality of alignment holes.

Optionally, the controller is configured to apply a magnetic field to the magnetic portions respectively in regions surrounding the array of the plurality of alignment holes to have a same magnetic polarity as the exposed magnetic portions of the array of the plurality of transfer heads.

Optionally, the array mask comprises an array of a plurality of ring structures, a respective one of the plurality of ring structures defining the respective one of the plurality of alignment holes; and the plurality of ring structures are the magnetic portions respectively in regions surrounding the array of the plurality of alignment holes.

Optionally, the plurality of transfer heads are made of a magnetic material.

Optionally, the plurality of ring structures are made of a magnetic material.

Optionally, the respective one of the plurality of transfer heads has a length greater than a thickness of the array mask.

Optionally, the plurality of transfer heads are a plurality of retractable transfer heads.

In another aspect, the present invention provides a method for transferring a micro light emitting diode (micro LED) using a micro LED transferring apparatus described herein, comprising placing a transfer array on a side of an array mask and a target substrate so that the array mask is disposed between the transfer array and the target substrate, the transfer array comprising an array of a plurality of transfer heads and having a plurality of micro LEDs respectively attached to the plurality of transfer heads, the array mask having an array of a plurality of alignment holes, and the target substrate having a bonding layer comprising an array of a plurality of bonding contacts; aligning the plurality of micro LEDs respectively attached to the plurality of transfer heads with the plurality of alignment holes; inserting the array of the plurality of transfer heads respectively through the array of the plurality of alignment holes; placing the plurality of micro LEDs respectively on the plurality of bonding contacts; and releasing the plurality of micro LEDs onto the target substrate.

Optionally, during inserting the array of the plurality of transfer heads respectively through the array of the plurality of alignment holes, the method further comprises applying a first voltage to the array of the plurality of transfer heads; and applying a second voltage to the array mask at least in regions surrounding the array of the plurality of alignment holes; wherein the first voltage and the second voltage are of a same polarity.

Optionally, during inserting the array of the plurality of transfer heads respectively through the array of the plurality of alignment holes, magnetic portions respectively in regions surrounding the array of the plurality of alignment holes have a same magnetic polarity as exposed magnetic portions of the array of the plurality of transfer heads.

Optionally, the method further comprises applying a magnetic field to the array of the plurality of transfer heads so that the exposed magnetic portions of the array of the plurality of transfer heads have the same magnetic polarity as the magnetic portions respectively in regions surrounding the array of the plurality of alignment holes.

Optionally, the method further comprises applying a magnetic field to the magnetic portions respectively in regions surrounding the array of the plurality of alignment holes to have the same magnetic polarity as the exposed magnetic portions of the array of the plurality of transfer heads.

Optionally, the method further comprises providing a mother substrate having an array of a plurality of micro LEDs; providing the transfer array comprising the array of the plurality of transfer heads; picking up the plurality of micro LEDs from the mother substrate by attaching the plurality of micro LEDs respectively to the plurality of transfer heads; providing the target substrate having the bonding layer comprising the array of the plurality of bonding contacts; providing the array mask having the array of the plurality of alignment holes; and aligning the array of the plurality of bonding contacts with the array of the plurality of alignment holes.

Optionally, aligning the array of the plurality of bonding contacts with the array of the plurality of alignment holes comprises optically aligning the array mask with respect to the target substrate using alignment marks on the target substrate and on the array mask.

In another aspect, the present invention provides a display apparatus, comprising the plurality of micro LEDs transferred by the method described herein, and a plurality of thin film transistors for driving light emission of the plurality of micro LEDs.

BRIEF DESCRIPTION OF THE FIGURES

The following drawings are merely examples for illustrative purposes according to various disclosed embodiments and are not intended to limit the scope of the present invention.

FIG. 4 is a schematic diagram illustrating the structure of a micro light emitting diode transferring apparatus in some embodiments according to the present disclosure.

FIG. 5 is a schematic diagram illustrating the structure of a micro light emitting diode transferring apparatus in some embodiments according to the present disclosure.

FIG. 6 is a plan view of a respective one of the plurality of electromagnets in an array mask in some embodiments according to the present disclosure.

FIG. 7 is a side view of a respective one of the plurality of electromagnets in an array mask in some embodiments according to the present disclosure.

FIG. 8 is a flow chart illustrating a method for transferring a micro light emitting diode in some embodiments according to the present disclosure.

FIGS. 9A to 9F illustrate a method for transferring a micro light emitting diode in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a micro light emitting diode display panel, each of the micro LEDs has to be transferred from a growth substrate to a target substrate. Considering the display panel includes thousands to millions of micro LEDs, a pick-and-place transfer process demands an extremely high alignment accuracy particularly when placing the micro LEDs on the target substrate. In conventional micro LED transfer methods, misalignment between the micro LEDs and the bonding contacts in the target substrate occurs frequently in the pick-and-place transfer or the transfer process using a transfer head, resulting in defects in the display panel.

Accordingly, the present disclosure provides, inter alia, a micro light emitting diode transferring apparatus, a method for transferring a micro light emitting diode, and a display apparatus that substantially obviate one or more of the problems due to limitations and disadvantages of the related art. In one aspect, the present disclosure provides a micro light emitting diode transferring apparatus. In some embodiments, the micro light emitting diode transferring apparatus includes a transfer array having an array of a plurality of transfer heads; and an array mask having an array of a plurality of alignment holes. Optionally, a respective one of the plurality of alignment holes has a size allowing a respective one of the plurality of transfer heads and a micro LED attached to the respective one of the plurality of transfer heads to pass through. The respective one of the plurality of alignment holes and the respective one of the plurality of transfer heads are configured to be aligned together so that the respective one of the plurality of alignment holes is placed at a position corresponding to the micro LED attached to the respective one of the plurality of transfer heads.

Figure 1:
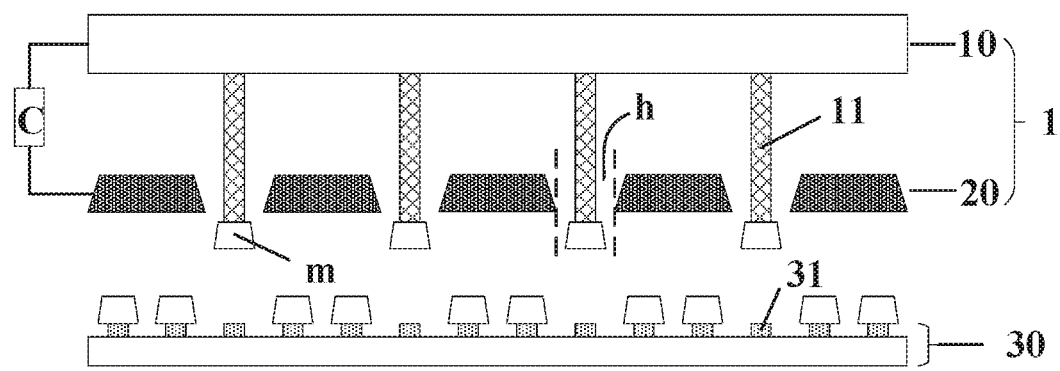
FIG. 1 is a schematic diagram illustrating the structure of a micro light emitting diode transferring apparatus in some embodiments according to the present disclosure.

FIG. 1 is a schematic diagram illustrating the structure of a micro light emitting diode transferring apparatus in some embodiments according to the present disclosure. Referring to FIG. 1, the micro light emitting diode transferring apparatus 1 in some embodiments includes a transfer array 10 having an array of a plurality of transfer heads 11; and an array mask 20 having an array of a plurality of alignment holes h. A respective one of the plurality of alignment holes h has a size allowing a respective one of the plurality of transfer heads 11 and a micro LED m attached to the respective one of the plurality of transfer heads 11 to pass through. The micro LED m attached to the respective one of the plurality of transfer heads 11 can be transferred to a respective one of a plurality of bonding contacts 31 in a target substrate 30. The respective one of the plurality of alignment holes h and the respective one of the plurality of transfer heads 11 are aligned together so that the respective one of the plurality of alignment holes h is placed at a position corresponding to the micro LED m attached to the respective one of the plurality of transfer heads 11.

Figure 2:
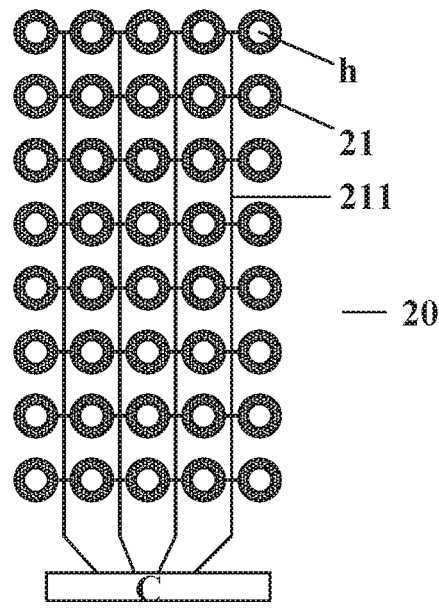
FIG. 2 is a schematic diagram illustrating the structure of an array mask in some embodiments according to the present disclosure.
Figure 3:
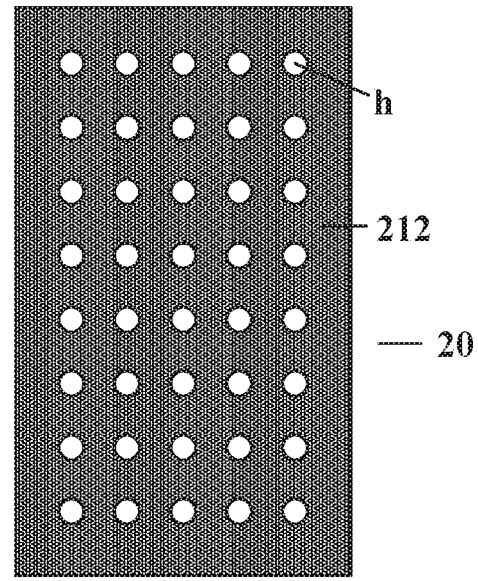
FIG. 3 is a schematic diagram illustrating the structure of an array mask in some embodiments according to the present disclosure.

The plurality of alignment holes h may be defined by various means. FIG. 2 is a schematic diagram illustrating the structure of an array mask in some embodiments according to the present disclosure. Referring to FIG. 2, the array mask 20 includes an array of a plurality of ring structures 21, a respective one of the plurality of ring structures 21 defining the respective one of the plurality of alignment holes h. Optionally, the plurality of ring structures 21 are interconnected together, e.g., through a plurality of bridges 211. FIG. 3 is a schematic diagram illustrating the structure of an array mask in some embodiments according to the present disclosure. Referring to FIG. 3, the array mask 20 includes an integral plate 212 having an array of a plurality of alignment holes h extending through the integral plate 212.

As used herein, the term "ring" or "ring structure" refers to a structure or portion of a structure having a hole there through, including but not limited to a ring or doughnut shape. A ring structure may be essentially round like a doughnut, or may be formed of a square, triangle or another shape with a hole there through. As used herein, a ring structure does not require that the ring shape be unbroken, and the term is intended to encompass structures that are substantially closed, but that comprise a break or a gap in the ring shape. The term encompasses structures that comprise cavity, e.g., a "C" and "U"-shaped cavity, for receiving a body part, and that are configured to form a stable grip or hold on body part such as a wrist. A ring structure may consist essentially of a single ring, or it may be a component of a larger structure having additional features, e.g., additional ring structures, or non-ring-shaped features such as corners, points, strings, etc.

Various appropriate transfer heads may be used in the present micro LED transferring apparatus. In some embodiments, the plurality of transfer heads 11 may have an elongated shape. Optionally, a respective one of the plurality of transfer heads 11 has a fixed length along a longitudinal direction of the elongated shape. Optionally, the plurality of transfer heads 11 are a plurality of retractable transfer heads, a respective one of the plurality of transfer heads 11 is retractable along the longitudinal direction of the elongated shape. The respective one of the plurality of transfer heads 11 has a length along the longitudinal direction of the elongated shape that is greater than a thickness of the array mask 20. In one example, the plurality of transfer heads 11 are a plurality of retractable transfer heads, the respective one of the plurality of transfer heads 11 in an extended state has a length along the longitudinal direction of the elongated shape that is greater than a thickness of the array mask 20.

Referring to FIG. 1, in some embodiments, the micro LED transferring apparatus 1 further includes a controller C configured to form an alignment mechanism for aligning the respective one of the plurality of transfer heads 11 and the micro LED m attached to the respective one of the plurality of transfer heads 11 with respect to the respective one of the plurality of alignment holes h when the respective one of the plurality of transfer heads 11 is inserted into the respective one of the plurality of alignment holes h. The controller C is coupled to the transfer array 10 and the array mask 20.

In some embodiments, the alignment process is an electrostatic force-directed alignment process. FIG. 4 is a schematic diagram illustrating the structure of a micro light emitting diode transferring apparatus in some embodiments according to the present disclosure. Referring to FIG. 4, the controller C in some embodiments is configured to apply a first voltage to the array of the plurality of transfer heads 11 and applying a second voltage to the array mask 20 at least in regions surrounding the array of the plurality of alignment holes h. Optionally, the first voltage and the second voltage are of a same polarity. For example, and referring to FIG. 2, the controller C may apply the second voltage of the same polarity to the array of the plurality of ring structures 21. In another example, and referring to FIG. 3, the controller C may apply the second voltage of the same polarity to an integral plate 212 of the array mask 20. The voltages of the same polarity applied to the array of the plurality of transfer heads 11 and the regions surrounding the array of the plurality of alignment holes h may form positive charges, as shown in FIG. 4. Optionally, the voltages of the same polarity applied to the array of the plurality of transfer heads 11 and the regions surrounding the array of the plurality of alignment holes h may form negative charges. Due to the same polarity of the charges, the electrostatic force between a respective one of the plurality of transfer heads 11 inserted into or about to be inserted into a respective one of the plurality of alignment holes h and the respective one of the plurality of alignment holes h ensures that they are accurately aligned with respect to each other.

In some embodiments, the alignment process is a magnetic force-directed alignment process. FIG. 5 is a schematic diagram illustrating the structure of a micro light emitting diode transferring apparatus in some embodiments according to the present disclosure. Referring to FIG. 5, in some embodiments, the alignment mechanism includes magnetic portions respectively in regions surrounding the array of the plurality of alignment holes h and exposed magnetic portions of the array of the plurality of transfer heads 11. The same magnetic polarity on the array of the plurality of transfer heads 11 and the regions surrounding the array of the plurality of alignment holes h may be a S polarity, as shown in FIG. 5. Optionally, the same magnetic polarity on the array of the plurality of transfer heads 11 and the regions surrounding the array of the plurality of alignment holes h may be a N polarity. Due to the same magnetic polarity, the magnetic force between a respective one of the plurality of transfer heads 11 inserted into or about to be inserted into a respective one of the plurality of alignment holes h and the respective one of the plurality of alignment holes h ensures that they are accurately aligned with respect to each other.

In one example, the plurality of transfer heads 11 are made of a magnetic material. In another example, and referring to FIG. 2, the plurality of ring structures 21 are made of a magnetic material. In another example, both the plurality of transfer heads 11 and the plurality of ring structures 21 are made of a magnetic material, and no external control is required to realize the magnetic force-directed alignment.

In some embodiments, the controller C is configured to apply a magnetic field to the array of the plurality of transfer heads 11 so that the exposed magnetic portions of the array of the plurality of transfer heads 11 have the same magnetic polarity as the magnetic portions respectively in regions surrounding the array of the plurality of alignment holes h (e.g., the plurality of ring structures 21 in FIG. 2). In one example, a respective one of the plurality of transfer heads 11 is an electromagnet including a core and a coil surrounding the core. The coil is electrically connected to the controller C. Upon receiving a controlling signal from the controller C, a magnetic field is generated, and the exposed magnetic portions of the array of the plurality of transfer heads 11 possess a magnetic polarity the same as that of the magnetic portions respectively in regions surrounding the array of the plurality of alignment holes h.

In some embodiments, the controller C is configured to apply a magnetic field to the magnetic portions respectively in regions surrounding the array of the plurality of alignment holes h to have the same magnetic polarity as the exposed magnetic portions of the array of the plurality of transfer heads 11. In one example, the array mask 20 further includes a coil surrounding a respective one of the regions surrounding the array of the plurality of alignment holes h. FIG. 6 is a plan view of a respective one of the plurality of electromagnets in an array mask in some embodiments according to the present disclosure. FIG. 7 is a side view of a respective one of the plurality of electromagnets in an array mask in some embodiments according to the present disclosure. Referring to FIG. 6 and FIG. 7, the array mask in some embodiments includes a plurality of electromagnets. A respective one of the plurality of electromagnets includes a core and a coil 22 surrounding the core. The core is a respective one of the plurality of ring structures 21 having a respective one of the plurality of alignment holes h extending through in the center. The coil 22 is electrically connected to the controller C. Upon receiving a controlling signal from the controller C, a magnetic field is generated, and the plurality of ring structures 21 possess a magnetic polarity the same as that of the exposed magnetic portions of the array of the plurality of transfer heads 11.

The array mask 20 and the transfer array 10 may be independently controlled. For example, the controller C in some embodiments includes a first sub-controller configured to apply a first voltage to the array of the plurality of transfer heads 11 and a second sub-controller configured to apply a second voltage to the array mask 20 at least in regions surrounding the array of the plurality of alignment holes h. The first voltage and the second voltage are of a same polarity. In another example, the controller C includes a first sub-controller configured to apply a first magnetic field to the array of the plurality of transfer heads 11 and a second sub-controller configured to apply a second magnetic field to the magnetic portions respectively in regions surrounding the array of the plurality of alignment holes h.

In some embodiments, the array mask 20 and the transfer array 10 may be controlled by a same controller. For example, the controller C in some embodiments is configured to simultaneously apply a first voltage to the array of the plurality of transfer heads 11 and apply a second voltage to the array mask 20 at least in regions surrounding the array of the plurality of alignment holes h. The first voltage and the second voltage are of a same polarity. In another example, the controller C is configured to simultaneously apply a magnetic field to the array of the plurality of transfer heads 11 and apply a magnetic field to the magnetic portions respectively in regions surrounding the array of the plurality of alignment holes h.

In another aspect, the present disclosure provides a method for transferring a micro light emitting diode. FIG. 8 is a flow chart illustrating a method for transferring a micro light emitting diode in some embodiments according to the present disclosure. Referring to FIG. 8, the method in some embodiments includes providing a substrate having an array of a plurality of micro LEDs; providing a transfer array having an array of a plurality of transfer heads; picking up the array of a plurality of micro LEDs from the mother substrate by attaching the plurality of micro LEDs respectively to the plurality of transfer heads; providing a target substrate having a bonding layer having an array of a plurality of bonding contacts; placing an array mask having an array of a plurality of alignment holes between the transfer array and the target substrate; aligning the array of the plurality of bonding contacts with the array of the plurality of alignment holes; aligning the array of the plurality of micro LEDs respectively attached to the array of the plurality of transfer heads with the array of the plurality of alignment holes; inserting the array of the plurality of transfer heads respectively through the array of the plurality of alignment holes; placing the array of the plurality of micro LEDs respectively on the array of the plurality of bonding contacts; and releasing the array of the plurality of micro LEDs onto the target substrate.

In one example, inserting the array of the plurality of transfer heads respectively through the array of the plurality of alignment holes is performed by moving the transfer array toward to target substrate. In another example, the plurality of transfer heads are a plurality of retractable transfer heads, and inserting the array of the plurality of transfer heads respectively through the array of the plurality of alignment holes is performed by extending the plurality of transfer heads.

FIGS. 9A to 9F illustrate a method for transferring a micro light emitting diode in some embodiments according to the present disclosure. Referring to FIG. 94A an array mask 20 is aligned with a target substrate 30. Specifically, an array of a plurality of alignment holes h in the array mask 20 are aligned with an array of a plurality of bonding contacts 31 in the target substrate 30. Various appropriate alignment methods may be used to align the array mask 20 with the target substrate 30. For example, one or both of the array mask 20 and the target substrate 30 may include alignment marks. In another example, the step of aligning the array of the plurality of bonding contacts 31 with the array of the plurality of alignment holes h is performed by optically aligning the array mask 20 with respect to the target substrate 30 using alignment marks on the target substrate 30 or on the array mask 20. Optical alignment using alignment marks can achieve a very high alignment accuracy.

In some embodiments, referring to FIG. 9A, the array mask 20 further includes one or more optical alignment devices 24 and one or more first alignment mark 23. A respective optical alignment device is aligned with a respective first alignment mark. The target substrate 30 further includes one or more second alignment mark 32. The respective optical alignment device is used to align the respective first alignment mark with a respective second alignment mark. In one example, the one or more optical alignment devices 24 includes an optical alignment lens. Optical alignment using the alignment marks can achieve an alignment accuracy in micro order.

Figure 9B:
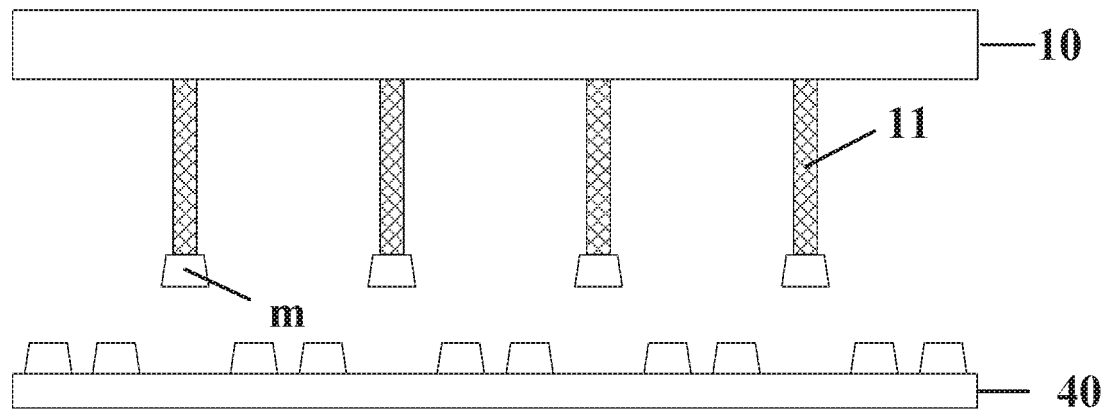

Referring to FIG. 9B, a transfer array 10 having an array of a plurality of transfer heads 11 is provided above a mother substrate 40 having a plurality of micro LEDs m. The method further includes picking up the array of a plurality of micro LEDs m from the mother substrate 40 by attaching the plurality of micro LEDs m respectively to the plurality of transfer heads 11. Similar to the alignment between the array mask 20 and the target substrate 30, the transfer array 10 and the mother substrate 40 can also be aligned by alignment marks on the transfer array 10 and on the mother substrate 40, as well as optical alignment devices.

Figure 9C:
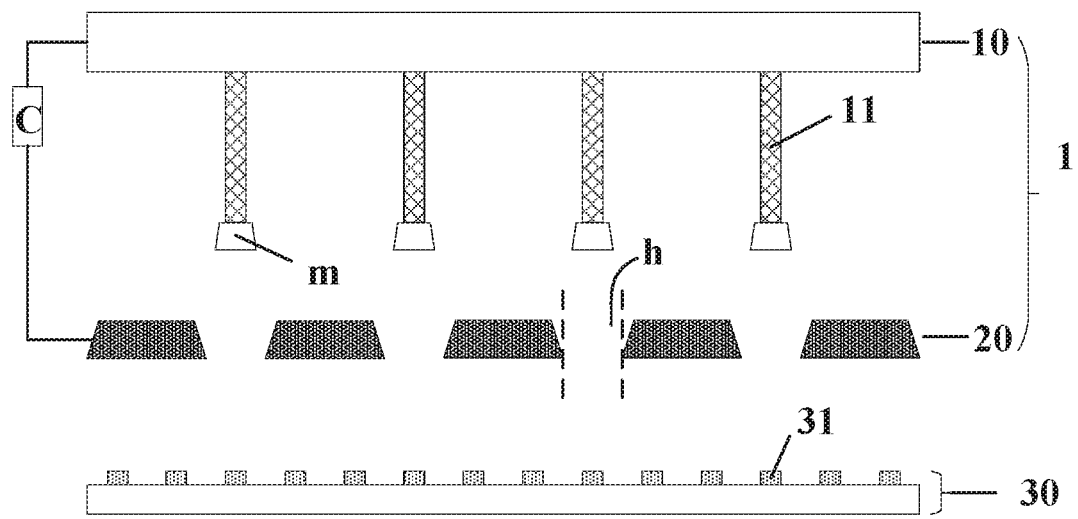

Referring to FIG. 9C, the transfer array 10 having the array of the plurality of micro LEDs m respectively attached to the array of the plurality of transfer heads 11 is positioned above the array mask 20 and the target substrate 30 pre-aligned together as described above. Accordingly, the array mask 20 having the array of the plurality of alignment holes h is disposed between the transfer array 10 and the target substrate 30.

Figure 9D:
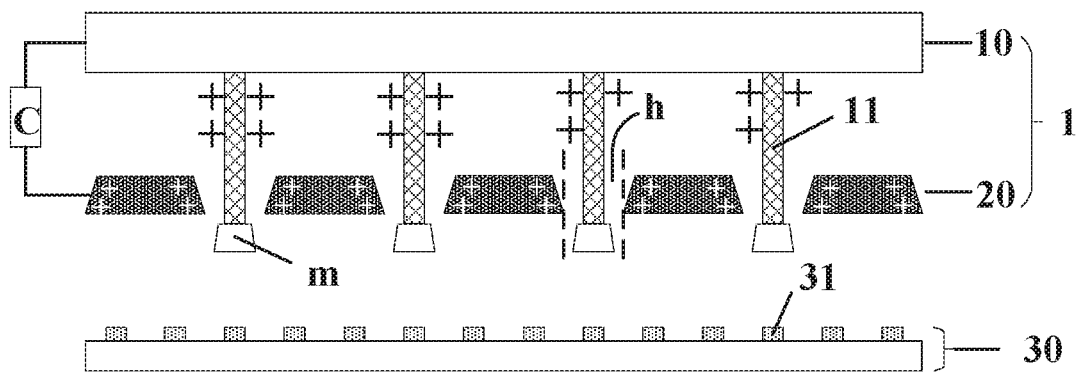

In some embodiments, the method further includes aligning the plurality of micro LEDs m respectively attached to the plurality of transfer heads 11 with the plurality of alignment holes h. Referring to FIG. 9D, the method further includes inserting the array of the plurality of transfer heads 11 respectively through the array of the plurality of alignment holes h. During the inserting process, the method further includes applying a first voltage to the array of the plurality of transfer heads 11 and applying a second voltage to the array mask 20 at least in regions surrounding the array of the plurality of alignment holes h, as shown in FIG. 9D. The first voltage and the second voltage are of a same polarity. For example, and referring to FIG. 2, the controller C may apply the second voltage of the same polarity to the array of the plurality of ring structures 21. The voltages of the same polarity applied to the array of the plurality of transfer heads 11 and the regions surrounding the array of the plurality of alignment holes h may form positive charges, as shown in FIG. 9D. Optionally, the voltages of the same polarity applied to the array of the plurality of transfer heads 11 and the regions surrounding the array of the plurality of alignment holes h may form negative charges. Due to the same polarity of the charges, the electrostatic force between a respective one of the plurality of transfer heads 11 inserted into or about to be inserted into a respective one of the plurality of alignment holes h and the respective one of the plurality of alignment holes h ensures that they are accurately aligned with respect to each other.

Figure 9E:
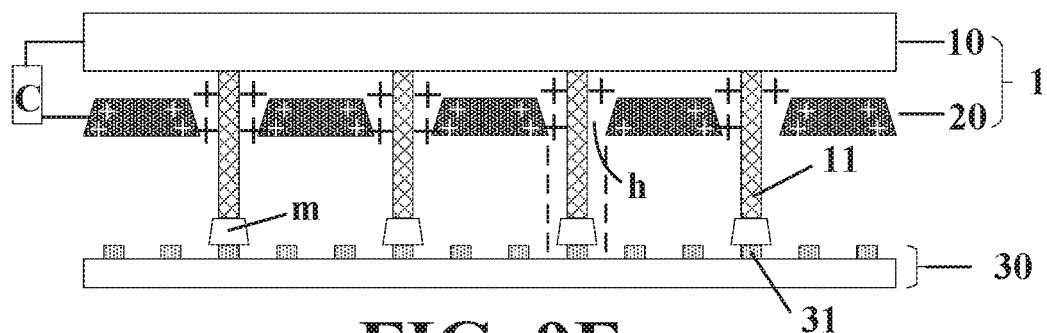
Figure 9F:
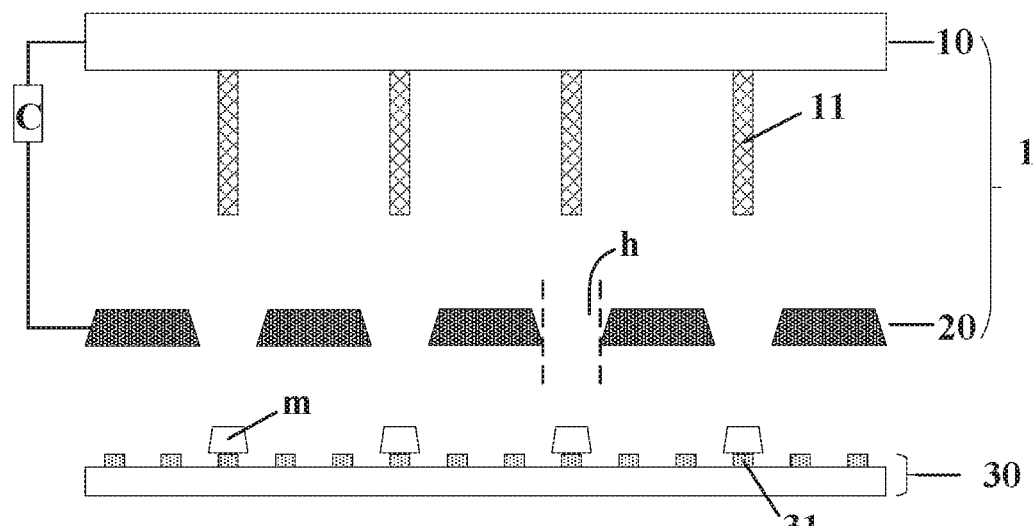

Referring to FIG. 9E, the method further includes placing the plurality of micro LEDs m respectively on the plurality of bonding contacts 31. During the process, the voltages in regions surrounding the array of the plurality of alignment holes h and in the array of the plurality of transfer heads 11 may be maintained. Referring to FIG. 9F, the method further includes releasing the plurality of micro LEDs m onto the target substrate 30, e.g., respectively on the plurality of bonding contacts 31.

Figure 10A:
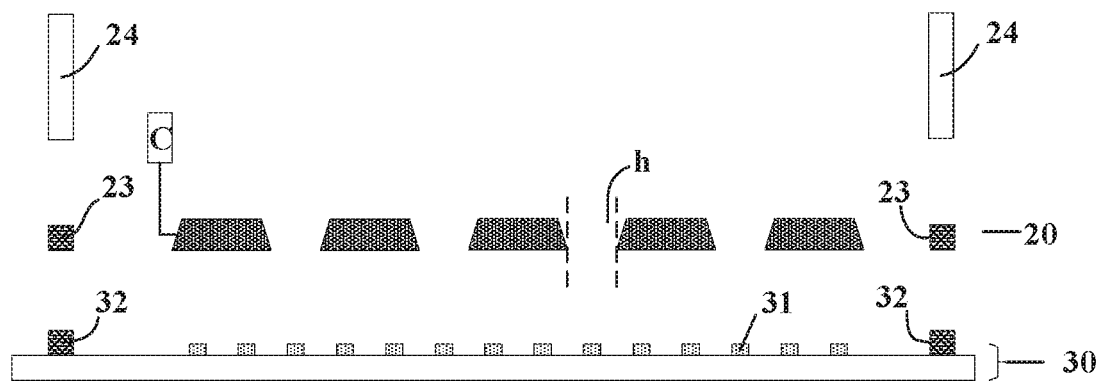
FIGS. 10A to 10F illustrate a method for transferring a micro light emitting diode in some embodiments according to the present disclosure.
Figure 10B:
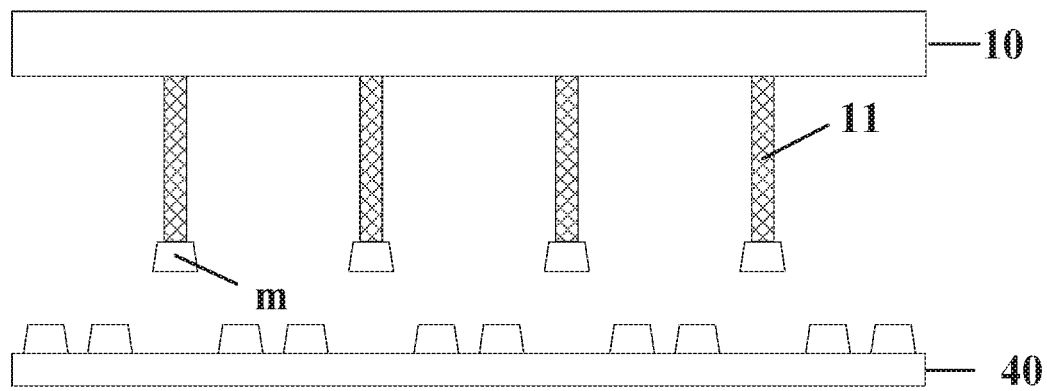
Figure 10C:
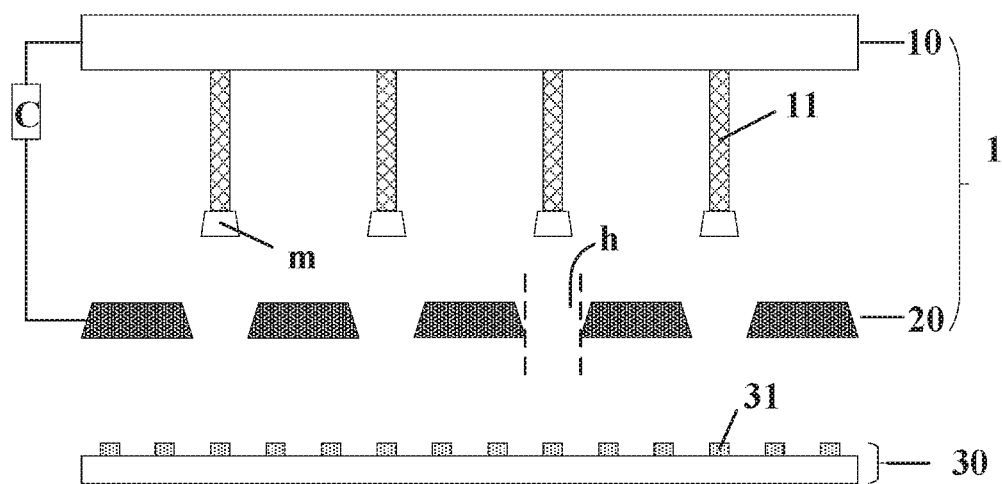
Figure 10D:
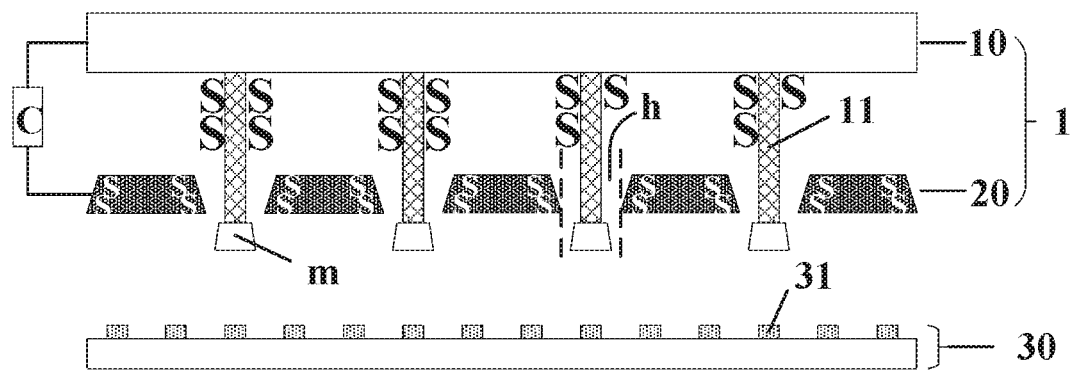
Figure 10E:
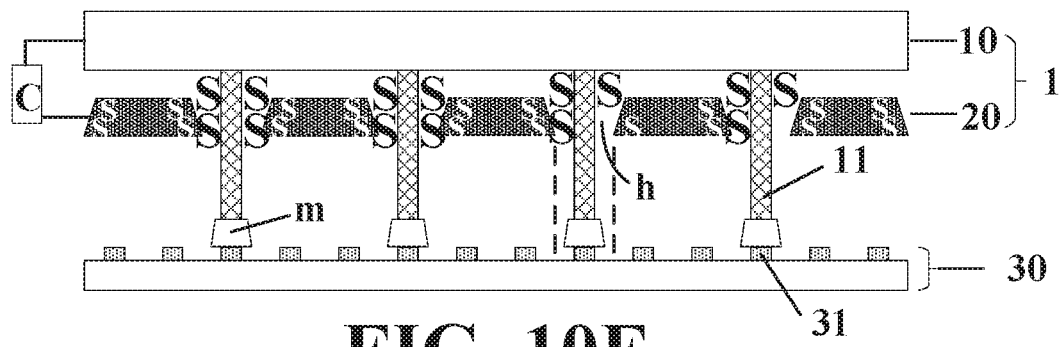
Figure 10F:
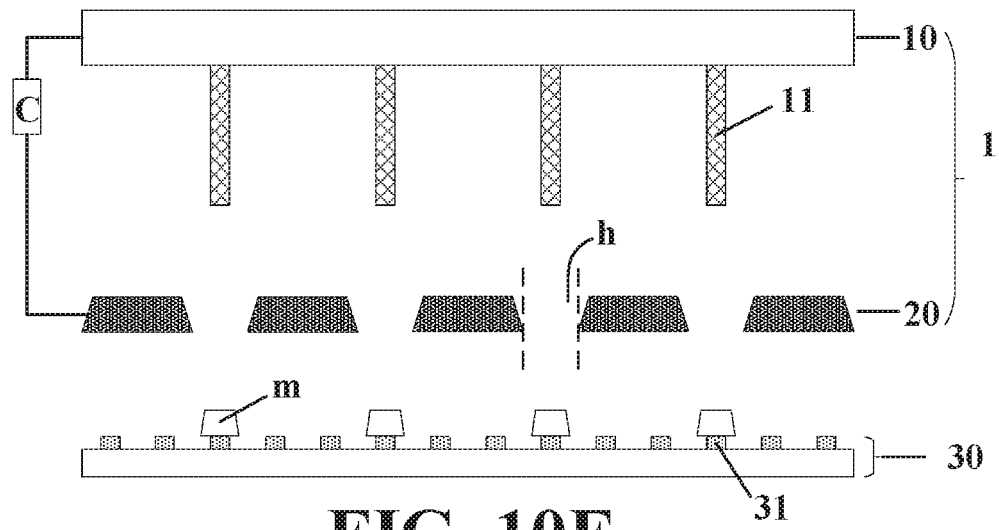

FIGS. 10A to 10F illustrate a method for transferring a micro light emitting diode in some embodiments according to the present disclosure. FIGS. 10A, 10B, 10C, and 10F illustrate processes largely similar to those depicted in FIGS. 9A, 9B, 9C, and 9F discussed above in connection with the electrostatic force-directed alignment process. FIGS. 10D and 10E depict a magnetic force-directed alignment process. Referring to FIG. 10D, the method further includes inserting the array of the plurality of transfer heads 11 respectively through the array of the plurality of alignment holes h. During the inserting process, magnetic portions respectively in regions surrounding the array of the plurality of alignment holes h are maintained to have a same magnetic polarity as exposed magnetic portions of the array of the plurality of transfer heads 11. In one example, portions respectively in regions surrounding the array of the plurality of alignment holes h are made of a magnetic material, and the method includes applying a magnetic field to the array of the plurality of transfer heads 11 so that the exposed magnetic portions of the array of the plurality of transfer heads 11 have the same magnetic polarity as the magnetic portions respectively in regions surrounding the array of the plurality of alignment holes h. In another example, exposed portions of the array of the plurality of transfer heads 11 are made of a magnetic material, and the method includes applying a magnetic field to the magnetic portions respectively in regions surrounding the array of the plurality of alignment holes h to have the same magnetic polarity as the exposed magnetic portions of the array of the plurality of transfer heads 11. In another example, the method includes applying a magnetic field to the array of the plurality of transfer heads 11 and applying a magnetic field of a same polarity to the magnetic portions respectively in regions surrounding the array of the plurality of alignment holes h, as shown in FIG. 10D. The same magnetic polarity on the array of the plurality of transfer heads 11 and the regions surrounding the array of the plurality of alignment holes h may be a S polarity, as shown in FIG. 10D and FIG. 10E. Optionally, the same magnetic polarity on the array of the plurality of transfer heads 11 and the regions surrounding the array of the plurality of alignment holes h may be a N polarity. Due to the same magnetic polarity, the magnetic force between a respective one of the plurality of transfer heads 11 inserted into or about to be inserted into a respective one of the plurality of alignment holes h and the respective one of the plurality of alignment holes h ensures that they are accurately aligned with respect to each other.

Referring to FIG. 10E, the method further includes placing the plurality of micro LEDs m respectively on the plurality of bonding contacts 31. During the process, the magnetism in the magnetic portions respectively in regions surrounding the array of the plurality of alignment holes h and in the exposed magnetic portions of the array of the plurality of transfer heads 11 may be maintained.

In another aspect, the present disclosure provides an array substrate including the plurality of micro LEDs transferred by the method described herein, and a plurality of thin film transistors for driving light emission of the plurality of micro LEDs. In another aspect, the present disclosure provides a display panel including the array substrate described herein, and a counter substrate (e.g., a color filter substrate facing the array substrate). In another aspect, the present disclosure provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a micro light emitting diode transferring apparatus. In some embodiments, the method includes forming a transfer array and forming an array mask. Forming the transfer array includes forming an array of a plurality of transfer heads on a first base substrate. Forming the array mask includes forming a structure defining an array of a plurality of alignment holes. Optionally, forming the array mask includes forming an array of a plurality of ring structures, a respective one of the plurality of ring structures defining the respective one of the plurality of alignment holes. Optionally, a respective one of the plurality of alignment holes is formed to have a size allowing a respective one of the plurality of transfer heads and a micro LED attached to the respective one of the plurality of transfer heads to pass through. Optionally, the plurality of transfer heads are formed as a plurality of retractable transfer heads.

In some embodiments, the method further includes forming a controller configured to form an alignment mechanism for aligning the respective one of the plurality of transfer heads and the micro LED attached to the respective one of the plurality of transfer heads with respect to the respective one of the plurality of alignment holes when the respective one of the plurality of transfer heads is inserted into the respective one of the plurality of alignment holes.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A micro light emitting diode (micro LED) transferring apparatus, comprising:
    a transfer array comprising an array of a plurality of transfer heads;
    an array mask having an array of a plurality of alignment holes; and
    a controller configured to form an alignment mechanism for aligning a respective one of the plurality of transfer heads and a micro LED attached to the respective one of the plurality of transfer heads with respect to a respective one of the plurality of alignment holes when the respective one of the plurality of transfer heads is inserted into the respective one of the plurality of alignment holes, by either applying a first voltage to the array of the plurality of transfer heads and a second voltage to the array mask or by applying a first magnetic polarity to the array of the plurality of transfer heads and a second magnetic polarity to the array mask;
    wherein the respective one of the plurality of alignment holes has a size allowing the respective one of the plurality of transfer heads and the micro LED attached to the respective one of the plurality of transfer heads to pass through; and
    wherein the controller is coupled to the transfer array and the array mask.

2. The micro LED transferring apparatus of claim 1, wherein the array mask comprises an array of a plurality of ring structures, a respective one of the plurality of ring structures defining the respective one of the plurality of alignment holes.

3. The micro LED transferring apparatus of claim 1, wherein the controller is configured to apply the first voltage to the array of the plurality of transfer heads and apply the second voltage to the array mask at least in regions surrounding the array of the plurality of alignment holes; and
    the first voltage and the second voltage are of a same polarity.

4. The micro LED transferring apparatus of claim 1, wherein the alignment mechanism comprises magnetic portions respectively in regions surrounding the array of the plurality of alignment holes and exposed magnetic portions of the array of the plurality of transfer heads.

5. The micro LED transferring apparatus of claim 4, wherein the controller is configured to apply a magnetic field to the array of the plurality of transfer heads so that the exposed magnetic portions of the array of the plurality of transfer heads have a same magnetic polarity as the magnetic portions respectively in regions surrounding the array of the plurality of alignment holes.

6. The micro LED transferring apparatus of claim 4, wherein the controller is configured to apply a magnetic field to the magnetic portions respectively in regions surrounding the array of the plurality of alignment holes to have a same magnetic polarity as the exposed magnetic portions of the array of the plurality of transfer heads.

7. The micro LED transferring apparatus of claim 4, wherein the array mask comprises an array of a plurality of ring structures, a respective one of the plurality of ring structures defining the respective one of the plurality of alignment holes; and
    the plurality of ring structures are the magnetic portions respectively in regions surrounding the array of the plurality of alignment holes.

8. The micro LED transferring apparatus of claim 4, wherein the plurality of transfer heads are made of a magnetic material.

9. The micro LED transferring apparatus of claim 7, wherein the plurality of ring structures are made of a magnetic material.

10. The micro LED transferring apparatus of claim 1, wherein the respective one of the plurality of transfer heads has a length greater than a thickness of the array mask.

11. The micro LED transferring apparatus of claim 1, wherein the plurality of transfer heads are a plurality of retractable transfer heads.

12. A method for transferring a micro light emitting diode (micro LED) using a micro LED transferring apparatus of claim 1, comprising:
    placing the transfer array on a side of the array mask and a target substrate so that the array mask is disposed between the transfer array and the target substrate, the transfer array comprising an array of a plurality of transfer heads and having a plurality of micro LEDs respectively attached to the plurality of transfer heads, the array mask having an array of a plurality of alignment holes, and the target substrate having a bonding layer comprising an array of a plurality of bonding contacts;
    aligning the plurality of micro LEDs respectively attached to the plurality of transfer heads with the plurality of alignment holes;
    inserting the array of the plurality of transfer heads respectively through the array of the plurality of alignment holes;
    placing the plurality of micro LEDs respectively on the plurality of bonding contacts; and
    releasing the plurality of micro LEDs onto the target substrate.

13. The method of claim 12, during inserting the array of the plurality of transfer heads respectively through the array of the plurality of alignment holes, further comprising:
    applying a first voltage to the array of the plurality of transfer heads; and
    applying a second voltage to the array mask at least in regions surrounding the array of the plurality of alignment holes;
    wherein the first voltage and the second voltage are of a same polarity.

14. The method of claim 12, wherein, during inserting the array of the plurality of transfer heads respectively through the array of the plurality of alignment holes, magnetic portions respectively in regions surrounding the array of the plurality of alignment holes have a same magnetic polarity as exposed magnetic portions of the array of the plurality of transfer heads.

15. The method of claim 14, further comprising applying a magnetic field to the array of the plurality of transfer heads so that the exposed magnetic portions of the array of the plurality of transfer heads have the same magnetic polarity as the magnetic portions respectively in regions surrounding the array of the plurality of alignment holes.

16. The method of claim 14, further comprising applying a magnetic field to the magnetic portions respectively in regions surrounding the array of the plurality of alignment holes to have the same magnetic polarity as the exposed magnetic portions of the array of the plurality of transfer heads.

17. The method of claim 12, further comprising:
providing a mother substrate having an array of a plurality of micro LEDs;
providing the transfer array comprising the array of the plurality of transfer heads;
picking up the plurality of micro LEDs from the mother substrate by attaching the plurality of micro LEDs respectively to the plurality of transfer heads;
providing the target substrate having the bonding layer comprising the array of the plurality of bonding contacts;
providing the array mask having the array of the plurality of alignment holes; and
aligning the array of the plurality of bonding contacts with the array of the plurality of alignment holes.

18. The method of claim 17, wherein aligning the array of the plurality of bonding contacts with the array of the plurality of alignment holes comprises optically aligning the array mask with respect to the target substrate using alignment marks on the target substrate and on the array mask.

* * * * *